(12) United States Patent
Mochizuki et al.

(10) Patent No.: US 9,711,600 B2
(45) Date of Patent: Jul. 18, 2017

(54) SEMICONDUCTOR DEVICE AND METHOD OF MANUFACTURING THE SAME, POWER CONVERSION DEVICE, THREE-PHASE MOTOR SYSTEM, AUTOMOBILE, AND RAILWAY VEHICLE

(71) Applicant: HITACHI, LTD., Chiyoda-ku, Tokyo (JP)

(72) Inventors: Kazuhiro Mochizuki, Tokyo (JP); Norifumi Kameshiro, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/916,801

(22) PCT Filed: Sep. 9, 2013

(86) PCT No.: PCT/JP2013/074222
§ 371 (c)(1),
(2) Date: Mar. 4, 2016

(87) PCT Pub. No.: WO2015/033463
PCT Pub. Date: Mar. 12, 2015

(65) Prior Publication Data
US 2016/0218187 A1    Jul. 28, 2016

(51) Int. Cl.
*H01L 21/46*    (2006.01)
*H01L 29/16*    (2006.01)
(Continued)

(52) U.S. Cl.
CPC ...... *H01L 29/1608* (2013.01); *B60L 11/1803* (2013.01); *H01L 29/0615* (2013.01);
(Continued)

(58) Field of Classification Search
CPC ............ H01L 29/0615; H01L 29/6606; H01L 29/8611; H01L 29/872; H01L 29/0619;
(Continued)

(56) References Cited

U.S. PATENT DOCUMENTS 4,780,426 A * 10/1988 Koshino ............... H01L 21/033
257/487
6,040,237 A * 3/2000 Bakowski ........... H01L 21/0465
257/E21.058
(Continued)

FOREIGN PATENT DOCUMENTS

JP    2008-103529 A    5/2008
JP    2010-267783 A    11/2010
(Continued)

OTHER PUBLICATIONS

Kaji, N. et al.; "Design and Fabrication of 20 kV-class SiC PiN Diodes with Space-Modulated JTE"; Extended Abstract of the $73^{rd}$ academic lecture presentation of the Japan Society of Applied Physics, p. 15-282.
(Continued)

*Primary Examiner* — Rita Leykin
(74) *Attorney, Agent, or Firm* — Miles & Stockbridge P.C.

(57) ABSTRACT

In a semiconductor device having a silicon carbide device, a technique capable of suppressing variation in a breakdown voltage and achieving reduction in an area of a termination structure is provided. In order to solve the above-described problem, in the present invention, in a semiconductor device having a silicon carbide device, a p-type first region and a p-type second region provided to be closer to an outer peripheral side than the first region are provided in a junction termination portion, a first concentration gradient is provided in the first region, and a second concentration gradient larger than the first concentration gradient is provided in the second region.

7 Claims, 12 Drawing Sheets

(51) Int. Cl.
*H01L 29/66* (2006.01)
*H01L 29/861* (2006.01)
*H01L 29/872* (2006.01)
*H01L 29/06* (2006.01)
*B60L 11/18* (2006.01)
*H02M 7/537* (2006.01)
*H02P 27/06* (2006.01)
*H01L 29/36* (2006.01)

(52) U.S. Cl.
CPC .......... *H01L 29/0619* (2013.01); *H01L 29/36* (2013.01); *H01L 29/6606* (2013.01); *H01L 29/8611* (2013.01); *H01L 29/872* (2013.01); *H02M 7/537* (2013.01); *H02P 27/06* (2013.01)

(58) Field of Classification Search
CPC   H01L 29/1608; B60L 11/1803; H02M 7/537; H02P 27/06
USPC .......... 438/542, 545, 546, 549, 570; 257/E21.056, E21.064, E21.135; 318/400.26, 400.27
See application file for complete search history.

(56) References Cited

U.S. PATENT DOCUMENTS

| | | | |
|---|---|---|---|
| 7,026,650 B2 | 4/2006 | Ryu et al. | |
| 7,265,388 B2* | 9/2007 | Fukuda | H01L 29/045 257/328 |
| 7,306,982 B2* | 12/2007 | Yamazaki | H01L 21/2022 257/E21.133 |
| 7,372,114 B2* | 5/2008 | Sakama | G02B 27/017 257/411 |
| 7,498,633 B2* | 3/2009 | Cooper | H01L 29/0696 257/256 |
| 7,589,032 B2* | 9/2009 | Yamazaki | B23K 26/0823 257/E21.328 |
| 7,919,403 B2* | 4/2011 | Tarui | H01L 21/046 257/E21.056 |
| 8,030,162 B2* | 10/2011 | Yoshie | H01L 21/0465 257/328 |
| 8,143,094 B2* | 3/2012 | Tarui | H01L 21/0455 438/105 |
| 8,258,052 B2 | 9/2012 | Okuno et al. | |
| 8,461,007 B2* | 6/2013 | Yamazaki | H01L 21/383 438/287 |
| 8,637,386 B2 | 1/2014 | Zhang et al. | |
| 8,716,717 B2* | 5/2014 | Kawakami | H01L 29/0634 257/288 |
| 8,866,158 B2* | 10/2014 | Hamada | H01L 21/046 257/77 |
| 8,901,643 B2* | 12/2014 | Kim | H01L 29/7827 257/328 |
| 9,536,942 B2 | 1/2017 | Kawakami et al. | |
| 9,570,560 B2 | 2/2017 | Zhang et al. | |
| 2006/0118812 A1* | 6/2006 | Ohtsuka | H01L 29/0619 257/107 |
| 2011/0147766 A1 | 6/2011 | Tarui | |
| 2011/0151649 A1* | 6/2011 | Cooper | H01L 29/7395 438/478 |
| 2011/0195563 A1 | 8/2011 | Okuno et al. | |
| 2013/0140582 A1 | 6/2013 | Kawakami et al. | |
| 2014/0077226 A1* | 3/2014 | Kitani | H01L 29/872 257/77 |
| 2016/0079347 A1* | 3/2016 | Tomita | H01L 29/0615 257/484 |

FOREIGN PATENT DOCUMENTS

| | | |
|---|---|---|
| JP | 2011-165856 A | 8/2011 |
| JP | 2012-94683 A | 5/2012 |
| JP | 2012-195519 A | 10/2012 |
| JP | 2012-527117 A | 11/2012 |
| JP | 5-122810 B2 | 1/2013 |
| WO | WO 2004/066392 A1 | 8/2004 |
| WO | WO 2012/049872 A1 | 4/2012 |
| WO | 2013-136550 A1 | 9/2013 |
| WO | 2014-045480 A1 | 3/2014 |

OTHER PUBLICATIONS

Office Action issued Mar. 7, 2017 for related Japanese Application No. 2015-535257.

Feng et al.; "Space-Modulated Junction Termination Extension for Ultrahigh-Voltage p-i-n Diodes in 4H-SiC"; IEEE Transactions on Electron Devices; vol. 59; No. 2; Feb. 1, 2012; pp. 414-418.

Extended European Search Report mailed Mar. 13, 2017 for related European Patent Application No. 13892962.5.

* cited by examiner (a)

(b)

SEMICONDUCTOR DEVICE AND METHOD OF MANUFACTURING THE SAME, POWER CONVERSION DEVICE, THREE-PHASE MOTOR SYSTEM, AUTOMOBILE, AND RAILWAY VEHICLE

TECHNICAL FIELD

The present invention relates to a semiconductor device and a method of manufacturing the same, a power conversion device, a three-phase motor system, an automobile, and a railway vehicle.

BACKGROUND ART

As a background technique in the present technical field, Japanese Patent No. 5122810 (Patent Document 1) is cited. This publication document describes an edge termination structure for a silicon carbide device, and this edge termination structure has a plurality of concentric-circle floating guard rings in a silicon carbide layer, which are arranged so as to be separated from a silicon-carbide-based semiconductor junction.

In addition, the Extended Abstract of the 73rd academic lecture presentation of the Japan Society of Applied Physics (Non-Patent Document 1) describes a JTE (Junction Termination Extension: a junction termination portion, a junction termination extension portion, or an edge termination portion) structure obtained by combining a two-zone JTE and a space modulation type JTE.

PRIOR ART DOCUMENT

Patent Document

Patent Document 1: Japanese Patent No. 5122810

Non-Patent Document

Non-Patent Document 1: Extended Abstract of the 73rd academic lecture presentation of the Japan Society of Applied Physics, p. 15-282

SUMMARY OF THE INVENTION

Problems to be Solved by the Invention

In a semiconductor device having a silicon carbide device, a positive charge exists in an interface between silicon carbide and an insulating film that is formed for protecting a surface of the silicon carbide, and there is a possibility that this positive charge causes variation in a breakdown voltage of the semiconductor device through application of a high electric field. However, by employing the JTE structure described above in Non-Patent Document 1, the variation in the breakdown voltage of the semiconductor device can be suppressed even when the positive charge exists in the interface between the silicon carbide and the insulating film so as to have an amount of about $1 \times 10^{12}$ to $1 \times 10^{13}$ cm$^{-2}$.

However, the JTE having a width equal to or larger than 250 μm is required for the JTE structure described above in Non-Patent Document 1. Therefore, in the semiconductor device employing the JTE structure described in Non-Patent Document 1, an area of an active region as large as expected by a chip size cannot be taken, or the chip size increases even by securing the area of the active region, which results in increase in the cost. Consequently, it becomes disadvantageous for downsizing of a power conversion device using the semiconductor device and a three-phase motor system using the power conversion device, or the cost reduction becomes difficult. Further, it becomes disadvantageous for weight reduction of an automobile and a railway vehicle using the three-phase motor system, or the cost reduction becomes difficult.

Accordingly, in a semiconductor device having a silicon carbide device, the present invention provides a technique capable of suppressing variation in the breakdown voltage and capable of achieving reduction in an area of a termination structure.

Means for Solving the Problems

In order to solve the above-described problems, in the present invention, in a semiconductor device having a silicon carbide device, a p-type first region and a p-type second region provided closer to an outer peripheral side than the first region are provided in a junction termination portion, a first concentration gradient is provided in the first region, and a second concentration gradient larger than the first concentration gradient is provided in the second region.

Effects of the Invention

According to the present invention, in the semiconductor device having the silicon carbide device, the variation in the breakdown voltage can be suppressed, and the reduction in the area of the termination structure can be achieved.

Problems, configurations, and effects other than those described above will be larger apparent through the following description of embodiments.

BRIEF DESCRIPTIONS OF THE DRAWINGS

DETAILED DESCRIPTION OF PREFERRED EMBODIMENTS

Figure 1:
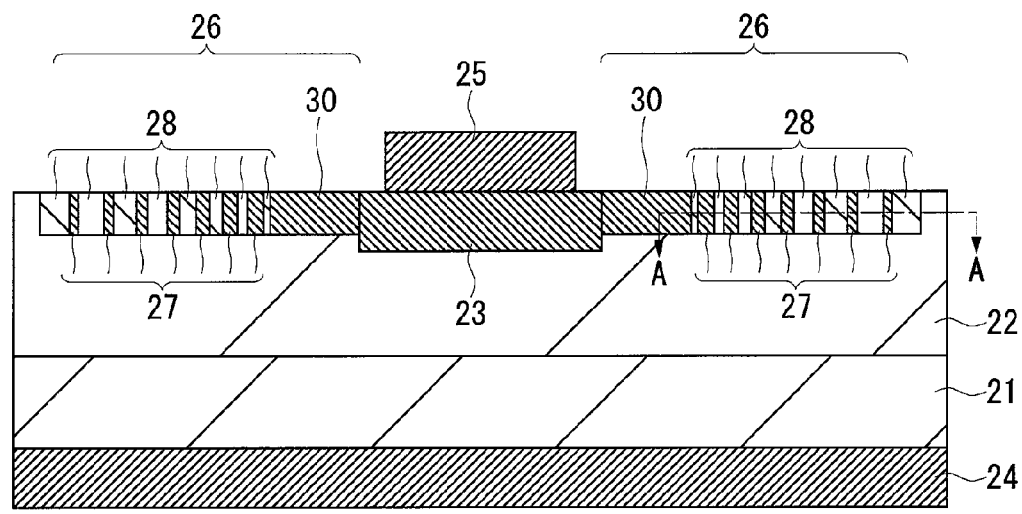
FIG. 1 is a cross-sectional view of a principal part illustrating a semiconductor device in which a JTE having a constant concentration gradient is provided in periphery of a silicon carbide p-n diode.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, when "formed of A", "formed by A", "having A", or "including A" is described for components or the like in embodiments, it goes without saying that other components are not eliminated unless otherwise specified to be only the component. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used even in a plan view so as to make the drawings easy to see. Also, components having the same function are denoted by the same reference symbols throughout all the drawings for describing the embodiments, and the repetitive description thereof is omitted. Hereinafter, the present embodiments will be described in detail based on the drawings.

First, a JTE structure studied prior to the present invention by the present inventors will be described.

A semiconductor device using silicon carbide for a semiconductor can reduce larger a loss in a power conversion device than that of a semiconductor device using silicon for a semiconductor. Therefore, a loss in a three-phase motor system can be reduced by using the power conversion device using the semiconductor device having the silicon carbide device for the three-phase motor system. In addition, since a cooling system for releasing heat generated due to the loss in the three-phase motor system can be simplified, weights of an automobile and a railway vehicle provided with the three-phase motor system can be reduced.

However, as described above in Patent Document 1, in the semiconductor device having the silicon carbide device, a positive charge of about $1\times10^{12}$ to $2\times10^{12}$ cm$^{-2}$ exists in an interface between the silicon carbide and an insulating film that is formed for protecting a surface of the silicon carbide, and there is a possibility that this positive charge causes variation in a breakdown voltage of the semiconductor device through application of a high electric field.

On the other hand, Non-Patent Document 1 described above proposes a technique of forming a JTE in periphery of a silicon carbide PIN (P-Intrinsic-N) diode, the JTE configured of a low-concentration region and a high-concentration region, and of sequentially reducing a ratio between a width and an interval of the high-concentration region larger as being closer to a chip end portion. Objects of the JTE are to reduce electric field concentration in an end portion of the silicon carbide device, and to reduce the variation in the breakdown voltage of the semiconductor device by suppressing uneven spread of a depletion region.

Accordingly, the present inventors have studied the JTE configured of a low-concentration region and a high-concentration region and having a constant concentration gradient in a semiconductor device having a silicon carbide p-n diode.

Figure 2:
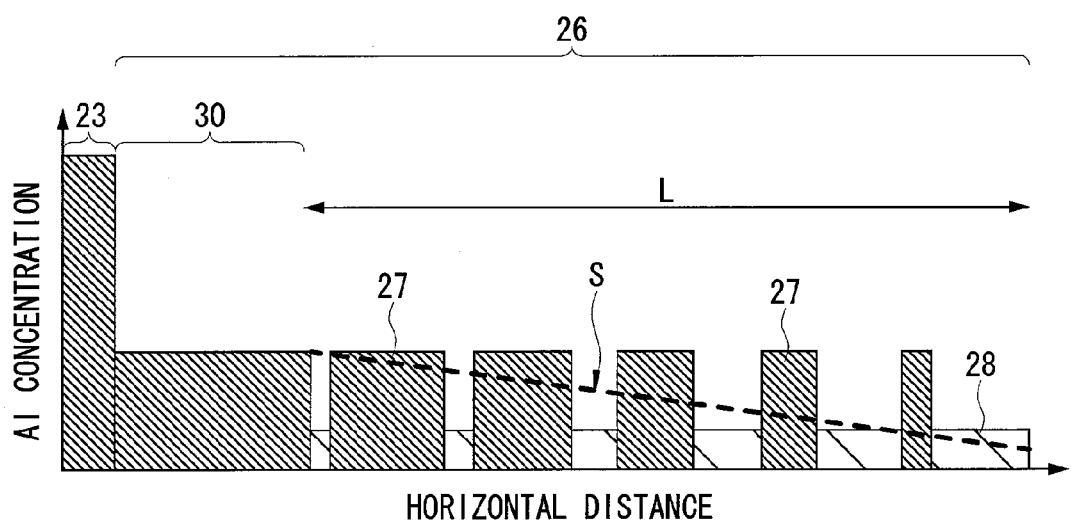
FIG. 2 is a schematic view illustrating a concentration distribution of a p-type impurity (aluminum (Al)) in a cross-sectional surface taken along a line A-A in FIG. 1.
Figure 3:
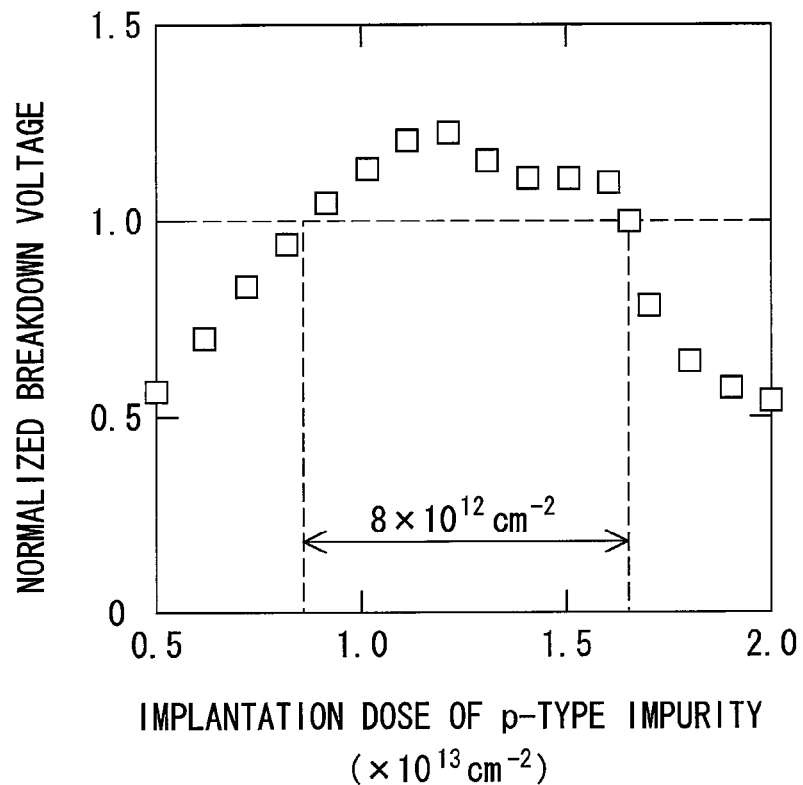
FIG. 3 is a graph diagram illustrating a relation between a breakdown voltage of the semiconductor device provided with the JTE having the constant concentration gradient in periphery of the silicon carbide p-n diode and an implantation dose of the p-type impurity to be ion-implanted into a high-concentration region of the JTE.

FIG. 1 is a cross-sectional view of a principal part illustrating the semiconductor device provided with the JTE having the constant concentration gradient in periphery of the silicon carbide p-n diode. FIG. 2 is a schematic diagram illustrating a concentration distribution of a p-type impurity (aluminum (Al)) in a cross-sectional surface taken along a line A-A in FIG. 1. FIG. 3 is a graph diagram illustrating a relation between a breakdown voltage of the semiconductor device provided with the JTE having the constant concentration gradient in periphery of the silicon carbide p-n diode and an implantation amount of the p-type impurity to be ion-implanted into a high-concentration region of the JTE. The semiconductor device is configured of the silicon carbide p-n diode and the JTE formed in periphery of the silicon carbide p-n diode, and is formed on one semiconductor chip.

As illustrated in FIG. 1, an n-type drift layer 22 is formed on a front surface of a substrate 21 made of n-type silicon carbide. A p-type region 23 is formed in a central region on an upper surface of the drift layer 22, and a JTE 26 is formed on the upper surface of the drift layer 22 so as to surround the p-type region 23. Further, an anode electrode 25 is electrically connected to the p-type region 23, and a cathode electrode 24 is electrically connected to a rear surface of the substrate 21, so that the silicon carbide p-n diode is configured.

The JTE 26 is configured of a p-type region 30 formed in periphery of the p-type region 23 in contact with the p-type region 23, a plurality of p-type high-concentration regions 27 having different widths and intervals from each other, and a plurality of p-type low-concentration regions 28 formed between themselves and an adjacent high-concentration regions 27 and having different widths and intervals from each other. Each of the p-type region 30, the high-concentration regions 27, and the low-concentration regions 28 is formed by introducing a p-type impurity such as aluminum into the drift layer 22 by an ion implantation method.

As illustrated in FIG. 2, a ratio between a width and an interval of the high-concentration region 27 is sequentially reduced larger as being closer to an outer side (chip end portion) of the JTE 26, and the JTE 26 has a constant concentration gradient "S". As described above, by employing the JTE structure having the constant concentration gradient S to the JTE 26, the variation in the breakdown voltage of the semiconductor device can be suppressed even when an implantation amount of the p-type impurity to be ion-implanted into the high-concentration region 27 is varied by, for example, about $8 \times 10^{12}$ cm$^{-2}$ as illustrated in FIG. 3.

Therefore, by employing the JTE structure having the constant concentration gradient S to the JTE 26, the variation in the breakdown voltage of the semiconductor device can be suppressed even when the amount of the positive charge existing in the interface between the silicon carbide and the insulating film is about $1 \times 10^{12}$ $(=(1+0) \times 10^{12})$ to $1 \times 10^{13}$ $(=(2+8) \times 10^{12})$ cm$^{-2}$.

However, the present inventors have found out that, when the JTE 26 has the constant concentration gradient S, it is required to set a width "L" of the JTE 26 except for the p-type region 30 to be equal to or larger than 250 μm, and therefore, an area of an active region as large as expected by a chip size cannot be taken, or the chip size is increased by taking the area of the active region, which results in increase in the cost.

Figure 4:
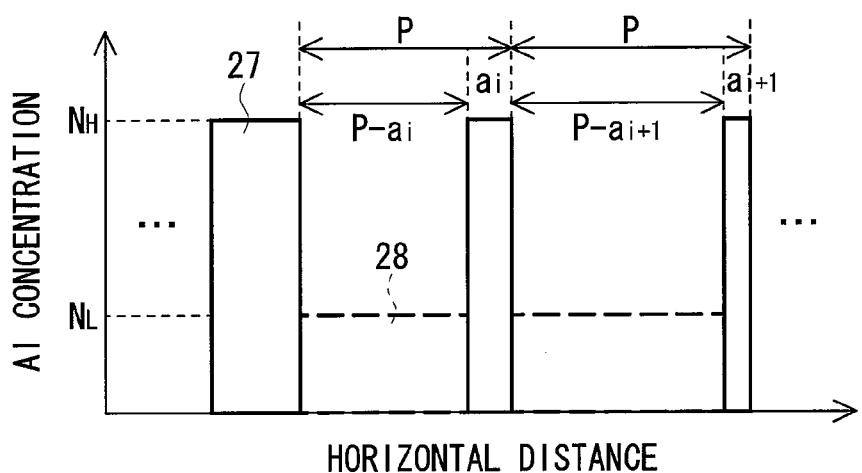
FIG. 4 is an explanatory diagram illustrating definition of the concentration gradient of the JTE.

Hereinafter, a reason why the JTE 26 requires the width L equal to or larger than 250 μm will be described with reference to FIG. 4 and FIG. 2. FIG. 4 is an explanatory diagram illustrating definition of the concentration gradient of the JTE.

As illustrated in FIG. 4, concentrations in the high-concentration region 27 and the low-concentration region 28 configuring the JTE 26 are represented as "$N_H$" and "$N_L$", respectively, and a sum of the widths of both the regions is represented as a constant pitch "P". In this case, when a width of the i-th high-concentration region 27 ("i" is a positive integer) is represented as "$a_i$", a plane concentration "$N_i$" in the i-th high-concentration region 27 and low-concentration region 28 is expressed as follows.

$$N_i = [N_H a_i + N_L(P - a_i)]/P$$

In addition, a plane concentration $N_{i+1}$ in the (i+1)-th high-concentration region 27 and low-concentration region 28 is expressed as follows.

$$N_{i+1} = [N_H a_{i+1} + N_L(P - a_{i+1})]/P$$

Therefore, the concentration gradient S in the horizontal direction is obtained as follows.

$$S = (N_i - N_{i+1})/P$$
$$= (a_i - a_{i+1})(N_H - N_L)/P^2$$

Even when the sum of the width of the high-concentration region 27 and the width of the low-concentration region 28 is not configured by the constant pitch, the concentration gradient S in the horizontal direction can be obtained by obtaining an average concentration every constant interval (for example, 10 μm).

Alternatively, an approximate value of the concentration gradient S can be obtained by using the width L of the JTE 26. As an example, a case in which the concentration $N_H$ in the high-concentration region 27 is $6 \times 10^{17}$ cm$^{-3}$ and the concentration $N_L$ in the low-concentration region 28 is $2 \times 10^{17}$ cm$^{-3}$ will be described. When the width L of the JTE 26 except for the p-type region 30 is 600 μm, the concentration gradient S becomes $0.7 \times 10^{15}$ cm$^{-3}$/μm. On the other hand, when the widths L are 250 μm, 200 μm, and 130 μm, the concentration gradient S becomes $1.6 \times 10^{15}$ cm$^{-3}$/μm, $2.0 \times 10^{15}$ cm$^{-3}$/μm, and $3.1 \times 10^{15}$ cm$^{-3}$/μm, respectively.

Accordingly, the JTE 26 having the width of the p-type region 30 fixed to 20 μm and having the width L of 600 μm, 250 μm, 200 μm, or 130 μm has been made, and the breakdown voltage of the semiconductor device has been evaluated under various conditions. As a result, in the semiconductor device having the JTE 26 with the width L of 600 μm or 250 μm, light emission due to avalanche breakdown has not been observed. On the other hand, in the semiconductor device having the JTE 26 with the width L of 200 μm, the light emission due to the avalanche breakdown has been observed in the vicinity of an outermost periphery or innermost periphery of the JTE 26. In addition, in the semiconductor device having the JTE 26 with the width L of 130 μm, the light emission due to the avalanche breakdown has been observed in various locations inside the JTE 26.

From this result, it is understood that it is required to set the concentration gradient S to be equal to or smaller than $1.6 \times 10^{15}$ cm$^{-3}$/μm in order to avoid the avalanche breakdown, and that it is required to set the width L of the JTE 26 to be equal to or larger than 250 μm for the setting. Therefore, even when the JTE 26 having the constant concentration gradient S of equal to or smaller than $1.6 \times 10^{15}$ cm$^{-3}$/μm is provided in periphery of the silicon carbide p-n diode in order to avoid the avalanche breakdown, it is required to set the width L of the JTE 26 to be equal to or larger than 250 μm, and therefore, the area of the active region as large as expected by the chip size cannot be taken, or the chip size is increased by taking the area of the active region, which results in increase in the cost.

Particularly, it is desirable that the size of the semiconductor chip be equal to or smaller than 2 to 3 mm square in order to avoid the reduction in the manufacturing yield of the semiconductor device using the silicon carbide for the semiconductor. Therefore, the fact that the area of the JTE cannot be reduced is a problem that directly leads to decrease in the effective area of the semiconductor chip (area obtained by excluding the area of the JTE from the area of the semiconductor chip).

First Embodiment

Figure 5:
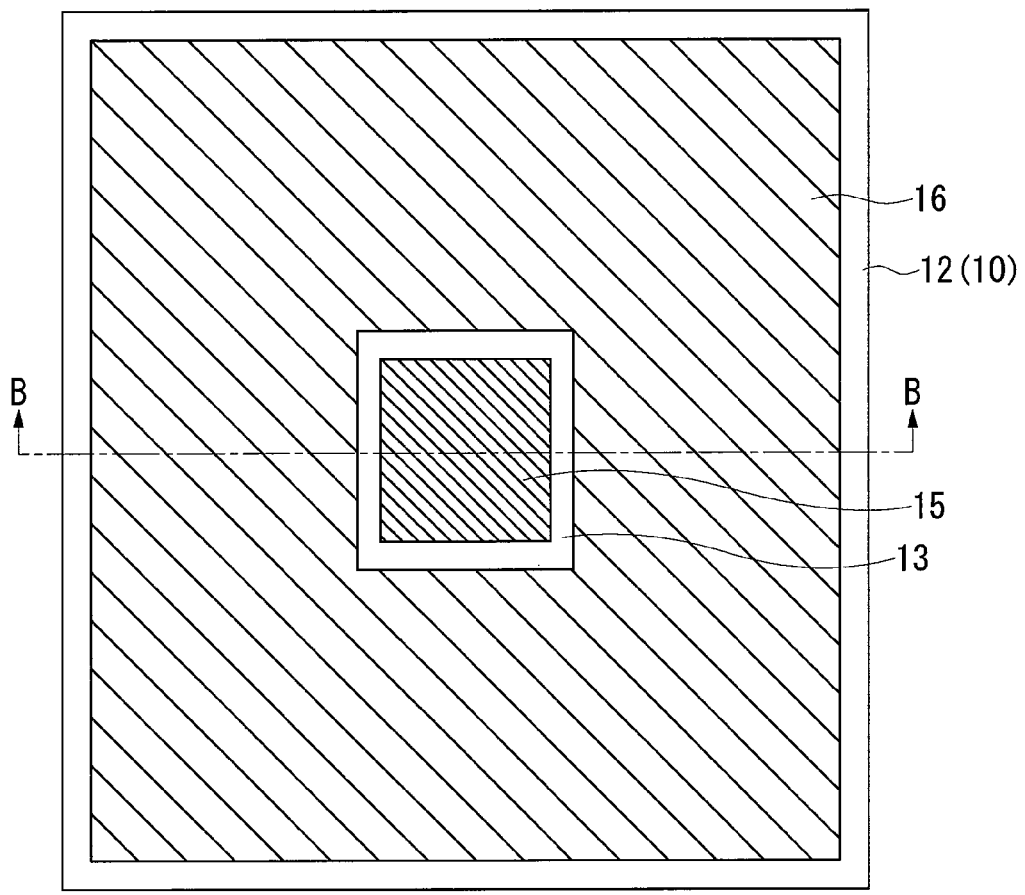
FIG. 5 is a plan view of a principal part illustrating an example of a configuration of a semiconductor device according to a first embodiment.
Figure 6:
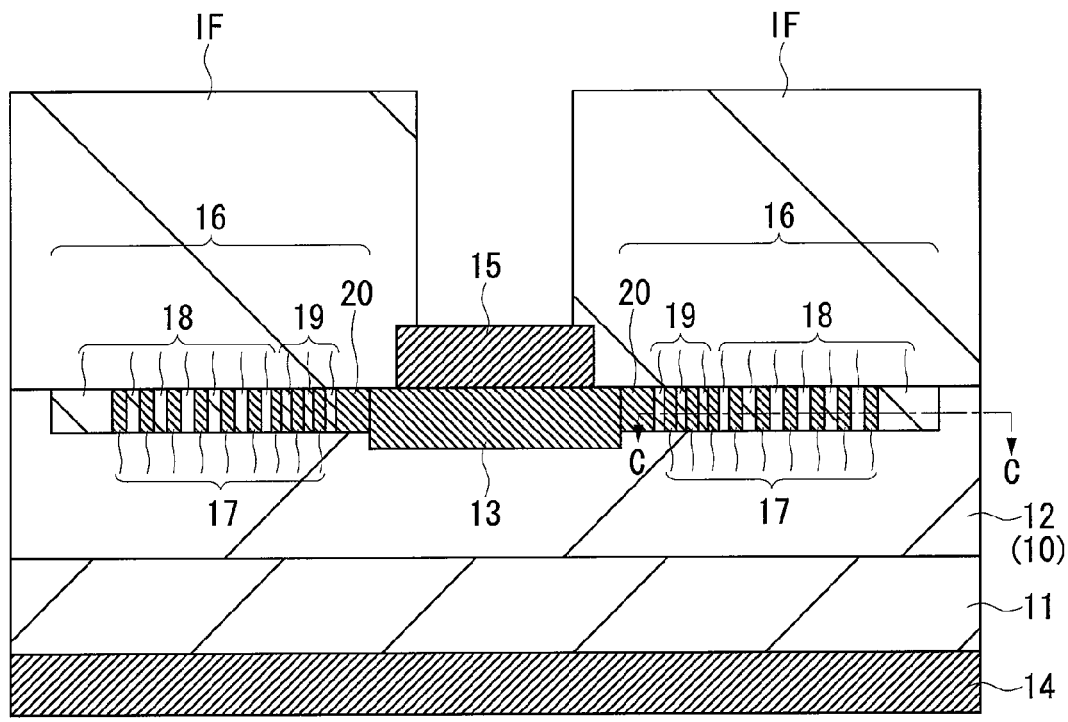
FIG. 6 is a cross-sectional view of the principal part (cross-sectional view of the principal part taken along a line B-B in FIG. 5) illustrating an example of the configuration of the semiconductor device according to the first embodiment.

A semiconductor device having a silicon carbide p-n diode according to a first embodiment will be described with reference to FIGS. 5 and 6. FIG. 5 is a plan view of a principal part illustrating an example of a configuration of the semiconductor device according to the first embodiment. FIG. 6 is a cross-sectional view of the principal part (cross-sectional view of the principal part taken along a line B-B in FIG. 5) illustrating an example of the configuration of the semiconductor device according to the first embodiment.

As illustrated in FIGS. 5 and 6, an epitaxial layer 10 made of n-type silicon carbide is formed on the front surface of a substrate 11 made of n-type silicon carbide, and this epitaxial layer 10 can be used as an n-type drift layer 12. A p-type region 13 is formed in a central region to be an active region on an upper surface of the epitaxial layer 10, and a JTE 16 is formed on the upper surface of the epitaxial layer 10 so as to surround the p-type region 13. An anode electrode 15 is electrically connected to the p-type region 13, and a cathode electrode 14 is electrically connected to the rear surface of the substrate 11, so that the silicon carbide p-n diode is configured. The semiconductor device has a rectangular shape with a length of a side of, for example, about 3 mm×3 mm.

The JTE 16 is configured of a p-type region 20 formed in periphery of the p-type region 13 in contact with the p-type region 13, a plurality of p-type high-concentration regions 17, a plurality of p-type medium-concentration regions 19, and a plurality of p-type low-concentration regions 18. Then, the high-concentration regions 17 and the medium-concentration regions 19 following the p-type region 20 are alternately formed in a region on an inner peripheral side of the JTE 16, the low-concentration regions 18 are formed in a region on an outer peripheral side of the JTE 16, and the high-concentration regions 17 and the low-concentration regions 18 are alternately formed in an intermediate region between the region on the inner peripheral side of the JTE 16 and the region on the outer peripheral side of the JTE 16. The p-type region 20, each high-concentration region 17, each medium-concentration region 19, and each low-concentration region 18 are formed by introducing a p-type impurity such as aluminum into the epitaxial layer 10 by an ion implantation method.

The p-type region 20 has a width of, for example, 20 µm, a depth from the upper surface of the epitaxial layer 10 of, for example, 0.8 µm, and an aluminum concentration of, for example, $6 \times 10^{17}$ cm$^{-3}$. In addition, the epitaxial layer 10 in the high-concentration region 17 has a depth from the upper surface of, for example, 0.8 µm, and an aluminum concentration of, for example, $6 \times 10^{17}$ cm$^{-3}$. The epitaxial layer 10 in the medium-concentration region 19 has a depth from the upper surface of, for example, 0.8 µm, and an aluminum concentration of, for example, $4 \times 10^{17}$ cm$^{-3}$. The epitaxial layer 10 in the low-concentration region 18 has a depth from the upper surface of, for example, 0.8 µm, and an aluminum concentration of, for example, $2 \times 10^{17}$ cm$^{-3}$.

Further, an insulating film IF is formed in order to protect the upper surface of the epitaxial layer 10, and this insulating film IF is provided with an opening portion for exposing the anode electrode 15.

Figure 7:
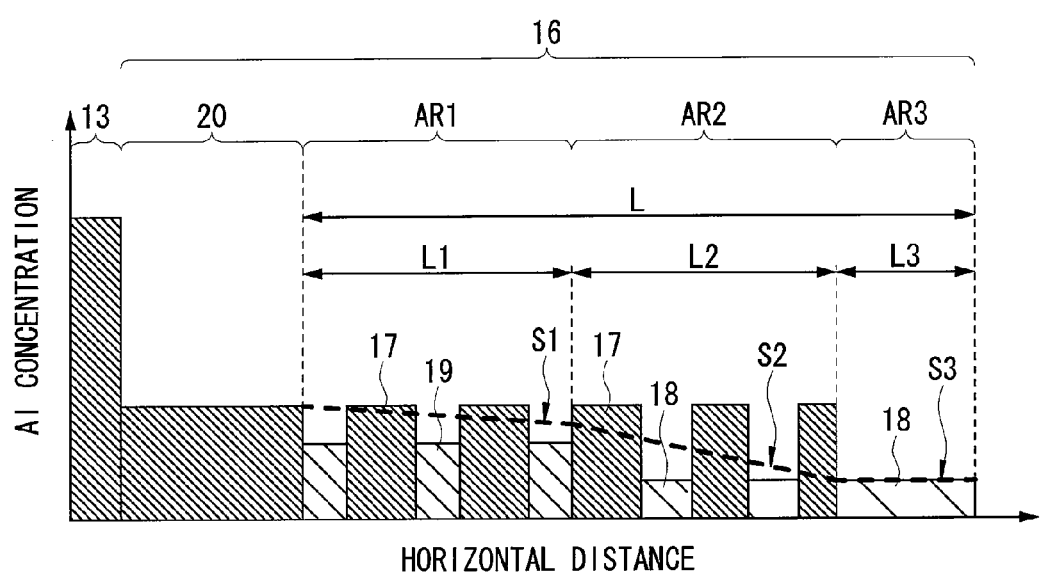
FIG. 7 is a schematic view illustrating a concentration distribution of a p-type impurity (aluminum (Al)) in a cross-sectional surface taken along a line C-C in FIG. 6.

Next, a structure of the JTE 16 will be described in detail with reference to FIG. 7. FIG. 7 is a schematic diagram illustrating a concentration distribution of the p-type impurity (aluminum (Al)) in a cross-sectional surface taken along a line C-C in FIG. 6.

As illustrated in FIG. 7, a plurality of regions having the gradually-decreasing concentrations are formed from an end portion of the p-type region 20 opposite to the p-type region 13 toward an outer periphery (chip end portion) of the JTE 16. In FIG. 7, toward the outer periphery of the JTE 16, a first region AR1 configured of the high-concentration region 17 and the medium-concentration region 19, a second region AR2 configured of the high-concentration region 17 and the low-concentration region 18, and a third region AR3 configured of the low-concentration region 18 are provided.

Then, a first concentration gradient S1 of the first region AR1 positioned on the inner peripheral side of the JTE 16 and a third concentration gradient S3 of the third region AR3 positioned on the outer peripheral side of the JTE 16 where the avalanche breakdown is easy to occur due to the variation in the breakdown voltage are set to be equal to or smaller than $1.6 \times 10^{15}$ cm$^{-3}$/µm. That is, the first concentration gradient S1 of the first region AR1 is set to be equal to or smaller than $1.6 \times 10^{15}$ cm$^{-3}$/µm, the second concentration gradient S2 of the second region AR2 is set to be larger than $1.6 \times 10^{13}$ cm$^{-3}$/µm and equal to or smaller than $6.3 \times 10^{15}$ cm$^{-3}$/µm, and the third concentration gradient S3 of the third region AR3 is set to be equal to or smaller than $1.6 \times 10^{15}$ cm$^{-3}$/µm.

By setting the first concentration gradient S1 of the first region AR1 to be equal to or smaller than $1.6 \times 10^{15}$ cm$^{-3}$/µm, the avalanche breakdown can be avoided on the inner peripheral side of the JTE 16 where an electric field intensity reaches a peak when the amount of the positive charge existing in the interface between the epitaxial layer 10 and the insulating film IF is about $1 \times 10^{13}$ cm$^{-2}$.

In addition, by setting the third concentration gradient S3 of the third region AR3 to be equal to or smaller than $1.6 \times 10^{15}$ cm$^{-3}$/µm, the avalanche breakdown can be avoided on the outer peripheral side of the JTE 16 where the electric field intensity reaches the peak when the amount of the positive charge existing in the interface between the epitaxial layer 10 and the insulating film IF is about 0 to $1 \times 10^{12}$ cm$^{-2}$. Note that the avalanche breakdown on the outer peripheral side of the JTE 16 is difficult to occur when the amount of the positive charge existing in the interface between the epitaxial layer 10 and the insulating film IF is not smaller than $2 \times 10^{12}$ cm$^{-2}$, and therefore, the third concentration gradient S3 becomes unnecessary.

In addition, by setting the second concentration gradient S2 of the second region AR2 to be larger than $1.6 \times 10^{13}$ cm$^{-3}$/µm and equal to or smaller than $6.3 \times 10^{13}$ cm$^{-3}$/µm, the width L of the JTE 16 except for the p-type region 20 can be shortened while the avalanche breakdown in the JTE 16 is avoided. This is because a width L1 of the first region AR1, a width L2 of the second region AR2, and a width L3 of the third region AR3 can be set independently to each other.

That is, in the first region AR1, the width L1 required for obtaining the first concentration gradient S1 (equal to or smaller than $1.6 \times 10^{13}$ cm$^{-3}$/µm) by which the avalanche breakdown can be avoided is set. Similarly, in the third region AR3, the width L3 required for obtaining the third concentration gradient S3 (equal to or smaller than $1.6 \times 10^{15}$ cm$^{-3}$/µm) by which the avalanche breakdown can be avoided is set. However, in the second region AR2, the avalanche breakdown is more difficult to occur than in the first region AR1 and the third region AR3, and therefore, the second concentration gradient S2 can be set to be larger than the first concentration gradient S1 and the third concentration gradient S3 (larger than $1.6 \times 10^{15}$ cm$^{-3}$/µm and equal to or smaller than $6.3 \times 10^{15}$ cm$^{-3}$/µm).

When the first concentration gradient S1 of $1.6 \times 10^{13}$ cm$^{-3}$/µm is obtained in the first region AR1, the width L1 of 125 µm can be set by adjusting the width of each of the high-concentration region 17 and the medium-concentration region 19. In addition, when the second concentration gradient S2 of $6.3 \times 10^{15}$ cm$^{-3}$/µm is obtained in the second region AR2, the width L2 of 32 μm can be set by adjusting the width of each of the high-concentration region 17 and the low-concentration region 18. In addition, when the third concentration gradient S3 of 0 cm$^{-3}$/μm is obtained in the third region AR3, the width L3 of, for example, 20 μm can be set by adjusting the width of the low-concentration region 18. In this manner, the width L of the JTE 16 except for the p-type region 20 can be set to 177 μm.

As described above, the concentration gradients of the region on the inner peripheral side (the first region AR1) of the JTE 16 and the region on the outer peripheral side (the third region AR3) thereof if necessary where the avalanche breakdown is easy to occur are set to be equal to or smaller than $1.6 \times 10^{15}$ cm$^{-3}$/μm. On the other hand, the concentration gradient of the intermediate region (the second region AR2) of the JTE 16 where the avalanche breakdown is difficult to occur is set to be larger than $1.6 \times 10^{13}$ cm$^{-3}$/μm and equal to or smaller than $6.3 \times 10^{15}$ cm$^{-3}$/μm so as to reduce the width of the intermediate region. In this manner, the variation in the breakdown voltage due to the positive charge existing in the interface between the epitaxial layer 10 and the insulating film IF is avoided, so that the avalanche breakdown can be avoided. Further, since the area of the JTE 16 can be reduced, the area of the active region larger than expected by the chip size can be taken, or the chip size can be reduced, which can result in decrease in the cost.

In addition, as described above, the JTE 16 is configured of the high-concentration region 17 having, for example, $6 \times 10^{17}$ cm$^{-3}$, the medium-concentration region 19 having, for example, $4 \times 10^{17}$ cm$^{-3}$, and the low-concentration region 18 having, for example, $2 \times 10^{17}$ cm$^{-3}$. Then, the medium-concentration region 19 is sandwiched by the high-concentration regions 17 in the first region AR1, and the low-concentration region 18 is sandwiched by the high-concentration regions 17 in the second region AR2.

Although details of the above-described configuration will be described in a method of manufacturing the semiconductor device to be described later, such a configuration can decrease the cost of the semiconductor device because the high-concentration region 17, the medium-concentration region 19, and the low-concentration region 18 can be formed by performing the ion implantation not three times but twice.

Next, the method of manufacturing the semiconductor device having the silicon carbide p-n diode according to the first embodiment will be described in the order of steps with reference to FIGS. 8 to 14. FIGS. 8 to 13 are cross-sectional views of the principal part of the semiconductor device according to the first embodiment. FIG. 14 is a process diagram describing the method of manufacturing the semiconductor device according to the first embodiment.

<Process P1>

Figure 8:
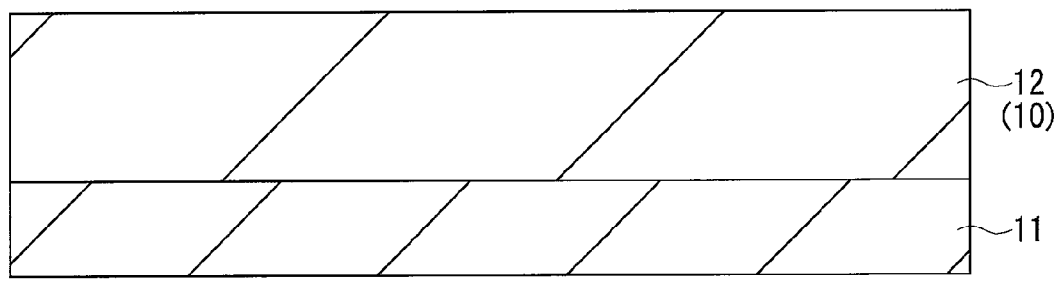
FIG. 8 is a cross-sectional view of a principal part illustrating a manufacturing process of the semiconductor device according to the first embodiment.

First, as illustrated in FIG. 8, the n-type substrate 11 mainly containing silicon carbide is prepared. Subsequently, the epitaxial layer 10 made of silicon carbide is formed on the front surface of the substrate 11 by an epitaxial growth method. The epitaxial layer 10 can be used as the drift layer 12. The substrate 11 and the epitaxial layer 10 contain the n-type impurity (for example, nitrogen), and an impurity concentration in the substrate 11 is higher than an impurity concentration in the epitaxial layer 10.

The impurity concentration in the substrate 11 is, for example, about $1 \times 10^{18}$ to $1 \times 10^{19}$ cm$^{-3}$. In addition, on the front surface of the substrate 11, a (0001) plane, a (000-1) plane, an (11-2) plane, or others can be used. However, any one of them may be selected.

Although a specification of the epitaxial layer 10 varies depending on the breakdown voltage set for the silicon carbide p-n diode which is formed through subsequent processes, the impurity contained in the epitaxial layer 10 is of the same conductivity type as that of the substrate 11, the impurity concentration of the same is, for example, about $1 \times 10^{15}$ to $4 \times 10^{16}$ cm$^{-3}$, and the thickness thereof is, for example, about 3 to 80 μm.

<Process P2>

Figure 9:
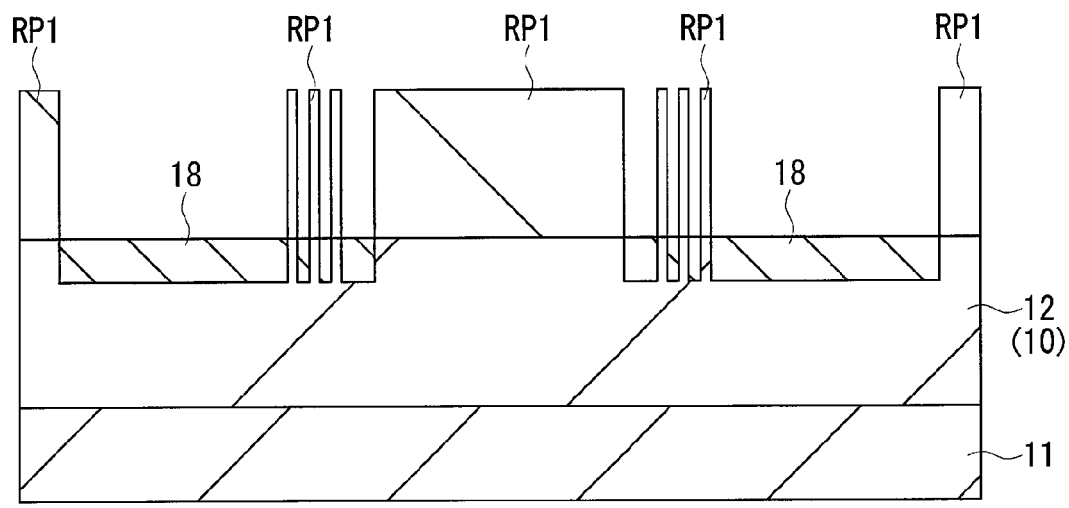
FIG. 9 is a cross-sectional view of a principal part illustrating a manufacturing process of the semiconductor device, continued from FIG. 8.

Next, as illustrated in FIG. 9, a mask material layer RP1 is formed on the upper surface of the epitaxial layer 10, and the p-type impurity (for example, aluminum) is ion-implanted into the upper surface of the epitaxial layer 10 exposed from the mask material layer RP1, so that the p-type low-concentration region 18 is formed on the upper surface of the epitaxial layer 10. The concentration of the p-type impurity (for example, aluminum) in the low-concentration region 18 is, for example, $2 \times 10^{17}$ cm$^{-3}$, and the implantation depth is, for example, 0.8 μm.

<Process P3>

Figure 10:
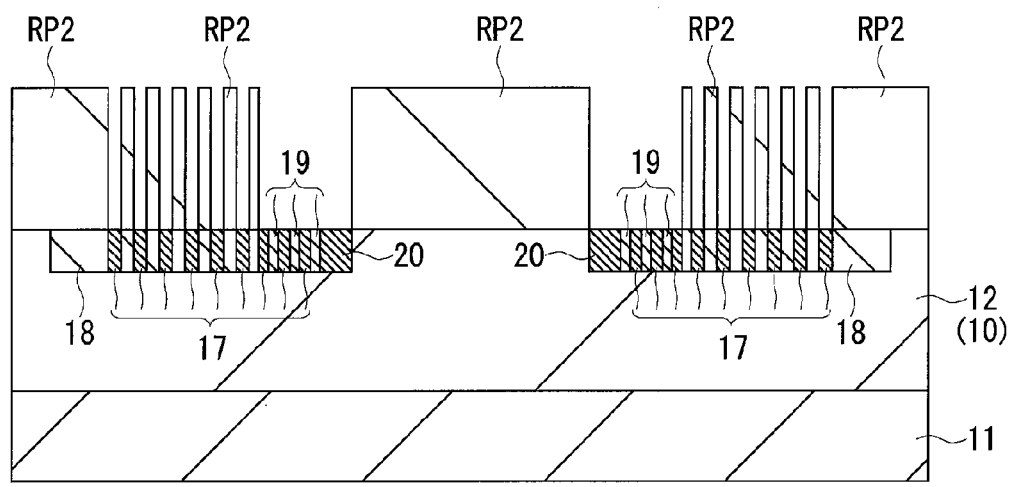
FIG. 10 is a cross-sectional view of a principal part illustrating a manufacturing process of the semiconductor device, continued from FIG. 9.

Next, as illustrated in FIG. 10, after the mask material layer RP1 is removed, a mask material layer RP2 is formed on the upper surface of the epitaxial layer 10, and the p-type impurity (for example, aluminum) is ion-implanted into the upper surface of the epitaxial layer 10 exposed from the mask material layer RP2, so that the p-type region 20, the high-concentration region 17, and the medium-concentration region 19 are formed on the upper surface of the epitaxial layer 10. At this time, if the p-type impurity (for example, aluminum) is ion-implanted into a region to which the ion implantation has not been performed, the impurity is ion-implanted under such conditions that the concentration of the p-type impurity (for example, aluminum) is, for example, $4 \times 10^{17}$ cm$^{-3}$ and that the implantation depth thereof is, for example, 0.8 μm.

Here, the p-type region 20 and the high-concentration region 17 are formed by ion-implanting the p-type impurity into a region where the low-concentration region 18 is formed. That is, the concentrations of the p-type impurity (for example, aluminum) in the p-type region 20 and the high-concentration region 17 is, for example, $6 \times 10^{17}$ cm$^{-3}$, and the implantation depth thereof is, for example, 0.8 μm so as to be superimposed on the concentration of the p-type impurity (for example, aluminum) in the already-formed low-concentration region 18 having the concentration of $2 \times 10^{17}$ cm$^{-3}$ and so as to have the implantation depth of 0.8 μm. On the other hand, the medium-concentration region 19 is formed by ion-implanting the p-type impurity into a region where the low-concentration region 18 has not been formed. That is, the concentration of the p-type impurity (for example, aluminum) in the medium-concentration region 19 is, for example, $4 \times 10^{17}$ cm$^{-3}$, and the implantation depth thereof is, for example, 0.8 μm.

<Process P4>

Figure 11:
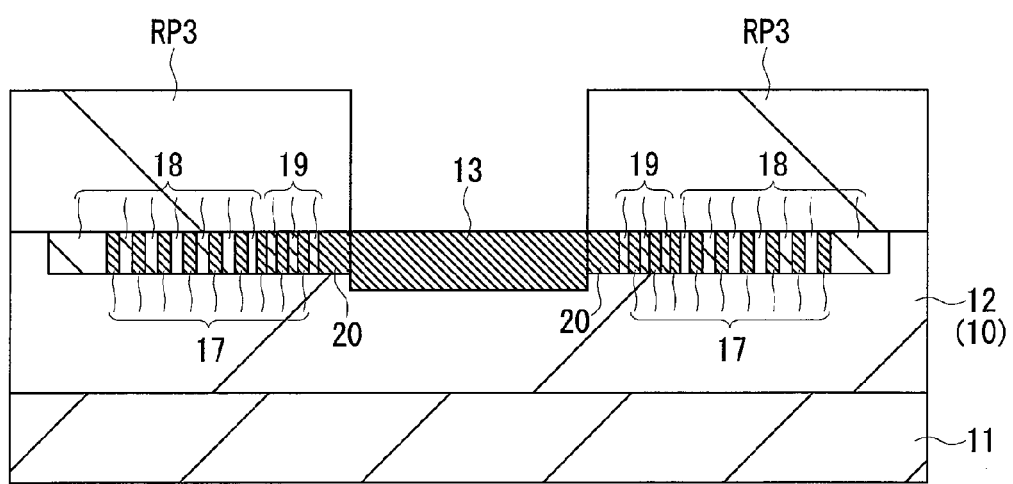
FIG. 11 is a cross-sectional view of a principal part illustrating a manufacturing process of the semiconductor device, continued from FIG. 10.

Next, as illustrated in FIG. 11, after the mask material layer RP2 is removed, a mask material layer RP3 is formed on the upper surface of the epitaxial layer 10, and the p-type impurity (for example, aluminum) is ion-implanted into the upper surface of the epitaxial layer 10 exposed from the mask material layer RP3, so that the p-type region 13 is formed in the central region on the upper surface of the epitaxial layer 10. The concentration of the p-type impurity (for example, aluminum) in the p-type region 13 is, for example, $2 \times 10^{19}$ cm$^{-3}$, and the implantation depth thereof is, for example, 0.8 μm.

<Process P5>

Next, after the mask material layer RP3 is removed, annealing is performed, and the ion-implanted impurity is activated. In this manner, the silicon carbide p-n diode configured of the p-type region 13 and the drift layer 12 is formed in the central region on the upper surface of the epitaxial layer 10, and the JTE 16 configured of the high-concentration region 17, the medium-concentration region 19, and the low-concentration region 18 is formed in periphery of the silicon carbide p-n diode.

<Process P6>

Figure 12:
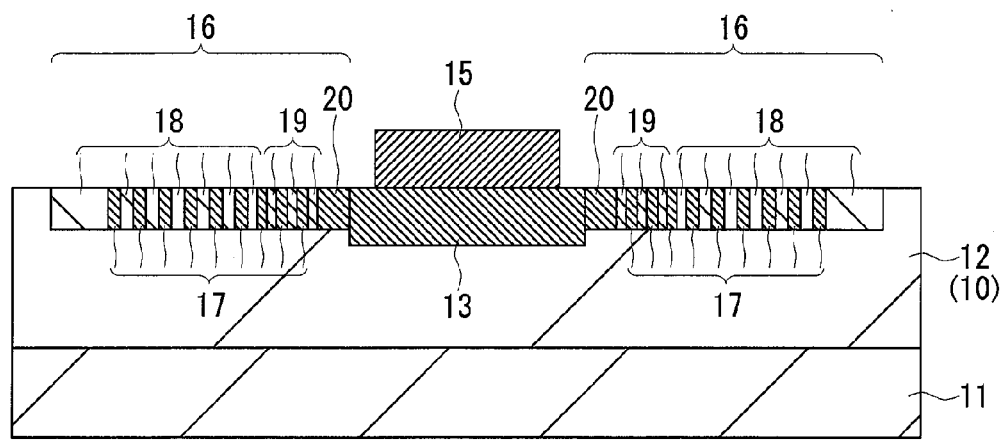
FIG. 12 is a cross-sectional view of a principal part illustrating a manufacturing process of the semiconductor device, continued from FIG. 11.

Next, as illustrated in FIG. 12, the anode electrode 15 is formed on an upper surface of the p-type region 13 by, for example, a sputtering method. Subsequently, the insulating film (whose illustration is omitted) is formed on the upper surface of the epitaxial layer 10 so as to expose an upper surface of the anode electrode 15.

<Process P7>

Figure 13:
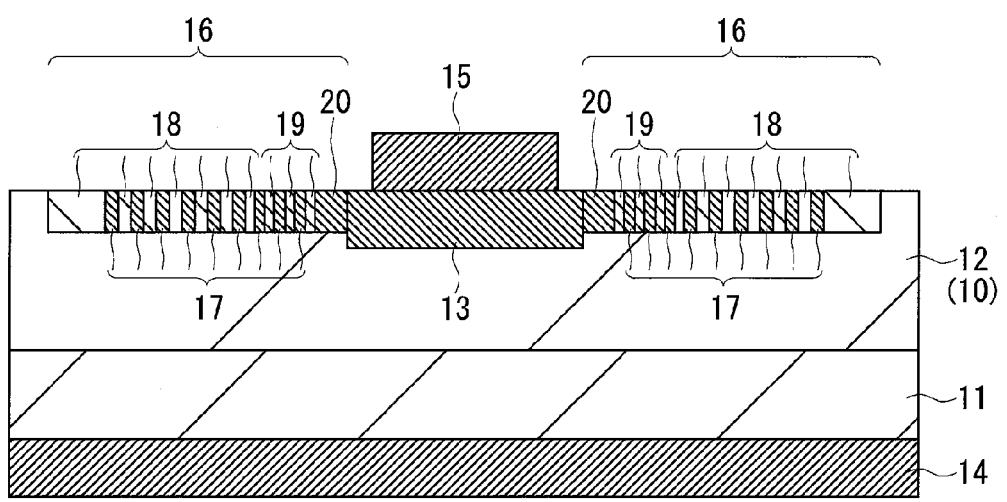
FIG. 13 is a cross-sectional view of a principal part illustrating a manufacturing process of the semiconductor device, continued from FIG. 12.
Figure 14:
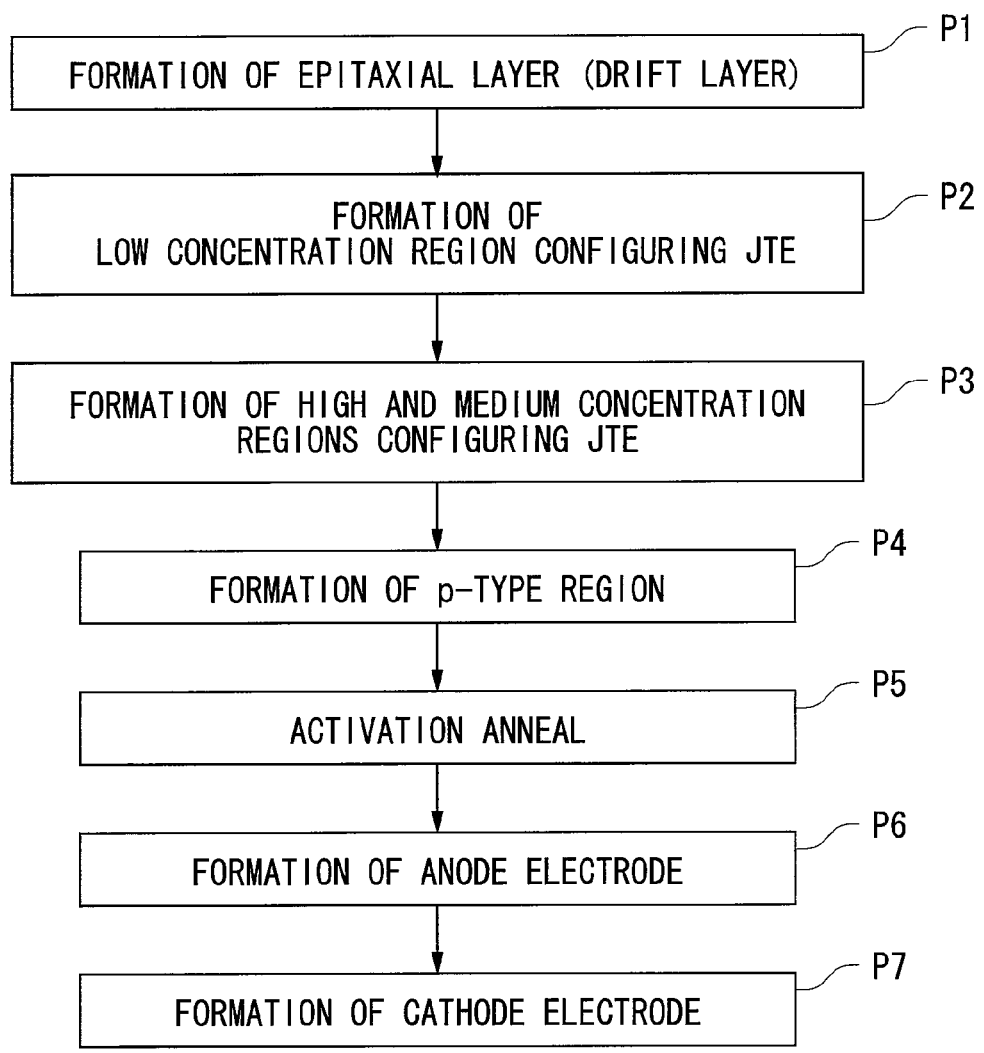
FIG. 14 is a process diagram explaining the manufacturing process of the semiconductor device according to the first embodiment.

Next, as illustrated in FIG. 13, the cathode electrode 14 is formed on the rear surface of the substrate 11 by, for example, the sputtering method.

In the above-described manner, the semiconductor device having the silicon carbide p-n diode according to the first embodiment can be manufactured.

As described above, according to the first embodiment, even when the positive charge exists in the interface between the silicon carbide and the insulating film, the variation in the breakdown voltage can be suppressed in the semiconductor device having the silicon carbide p-n diode. Further, since the area of the JTE 16 can be reduced, the area of the active region larger than expected by the chip size can be taken or the chip size can be reduced, which results in the decrease in the cost.

In addition, since the high-concentration region 17, the medium-concentration region 19, and the low-concentration region 18 configuring the JTE 16 can be formed by performing the ion implantation not three times but twice, the cost of the semiconductor device can be decreased.

Second Embodiment

Figure 15:
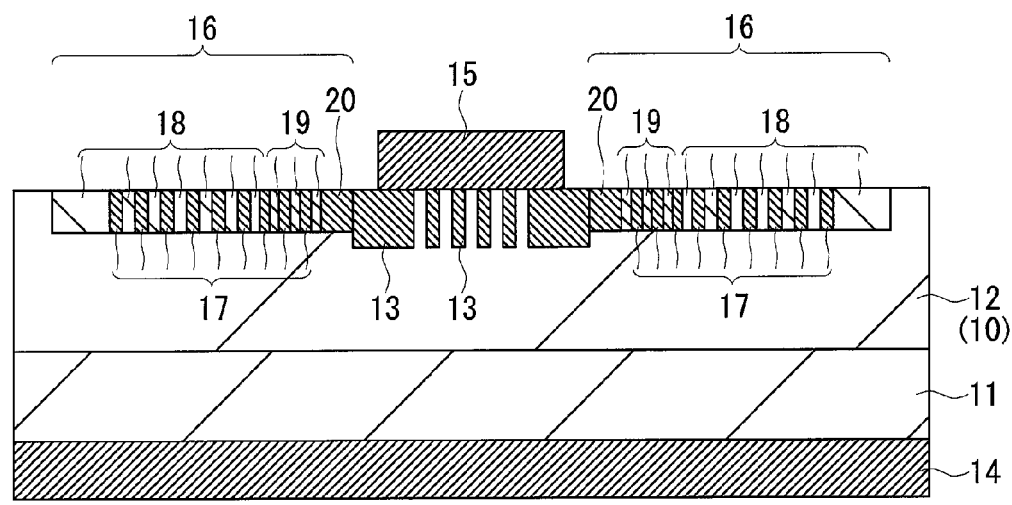
FIG. 15 is a cross-sectional view of a principal part illustrating an example of a configuration of a semiconductor device according to a second embodiment.

A semiconductor device having a silicon carbide JBS (Junction Barrier Schottky) diode according to a second embodiment will be described with reference to FIG. 15. FIG. 15 is a cross-sectional view of a principal part illustrating an example of a configuration of the semiconductor device according to the second embodiment.

As illustrated in FIG. 15, the silicon carbide JBS diode is a diode obtained by discretely forming the p-type region 13 in the silicon carbide p-n diode described in the first embodiment.

A thermionic electron emission current at the time in forward bias flows through a region of a drift layer 12 in which the p-type region 13 is not formed and which comes in direct Schottky contact with an anode electrode 15. The thermionic electron emission current flows at a lower voltage than that of a diffusion current of the silicon carbide p-n diode, and therefore, a forward voltage can be smaller in the silicon carbide JBS diode than the silicon carbide p-n diode. In addition, in reverse bias, a depletion layer spreads from the p-type region 13, so that the electric field intensity to be applied to the interface between the anode electrode 15 and the drift layer 12 is moderated. As a result, a reverse leakage current can be smaller in the silicon carbide JBS diode than the Schottky barrier diode having no p-type region 13.

A process of manufacturing the semiconductor device according to the second embodiment and the process of manufacturing the above-described semiconductor device according to the first embodiment are different from each other in only a process of manufacturing the p-type region 13. In the second embodiment, it is only required to form the above-described mask material layer PR3 illustrated FIG. 11 described above in a discrete pattern.

As described above, according to the second embodiment, also in the semiconductor device having the silicon carbide JBS diode, the same effect as in the first embodiment described above can be obtained.

Third Embodiment

Figure 16:
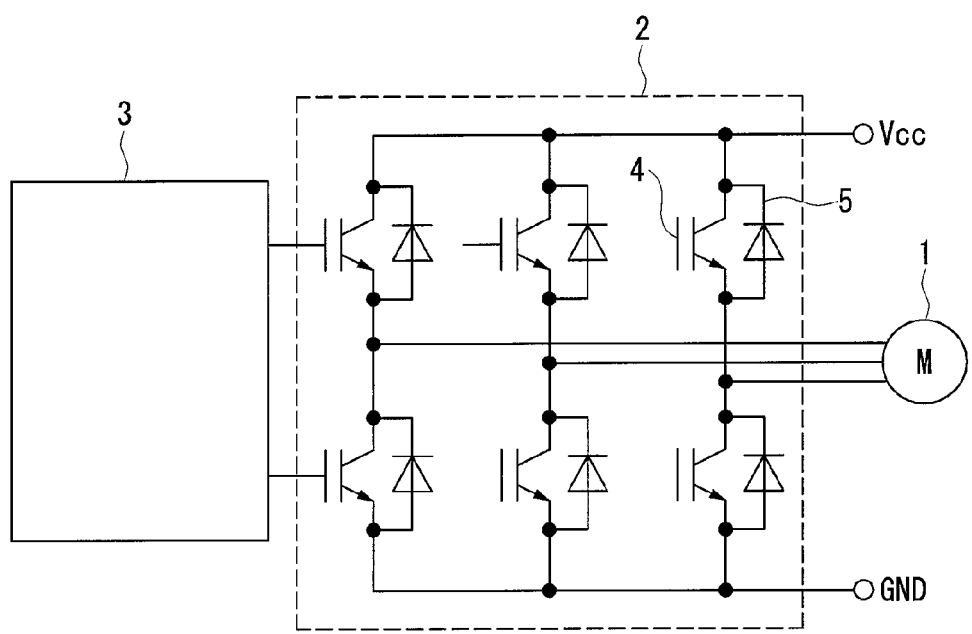
FIG. 16 is a circuit diagram illustrating an example of a power conversion device (inverter) according to a third embodiment.

The semiconductor device having the silicon carbide p-n diode described above in the first embodiment and the semiconductor device having the silicon carbide JBS diode described above in the second embodiment can be used in a power conversion device. A power conversion device according to a third embodiment will be described with reference to FIG. 16. FIG. 16 is a circuit diagram illustrating an example of the power conversion device (inverter) according to the third embodiment.

As illustrated in FIG. 16, an inverter 2 is configured of a switching element (for example, IGBT (Insulated Gate Bipolar Transistor)) 4 and a diode 5. In each single phase, the switching element 4 and the diode 5 are connected to each other so as to be antiparallel between a power supply potential (Vcc) and an input potential of a load (for example, a motor) 1, and the switching element 4 and the diode 5 are connected to each other so as to be antiparallel also between the input potential of the load 1 and a ground potential (GND). That is, in the load 1, the two switching elements 4 and the two diodes 5 are provided in each single phase, and therefore, the six switching elements 4 and the six diodes 5 are provided in three phases. Then, a control circuit 3 is connected to a gate electrode of each switching element 4, and the switching element 4 is controlled by this control circuit 3. Therefore, a current flowing through the switching element 4 configuring the inverter 2 is controlled by the control circuit 3, so that the load 1 can be driven.

The switching element 4 and the diode 5 are connected to each other so as to be antiparallel. A function of the diode 5 at this time will be described below.

The diode 5 is unnecessary because there is no reflux energy when the load 1 is pure resistance including no inductance. However, a case of connection of a circuit including the inductance such as a motor to the load 1 has a mode in which load current flows in a direction reverse to that of the turned-on switching element 4. At this time, since the single switching element 4 does not have a function of causing this load current to flow in the reverse direction, it is required to connect the diode 5 to the switching element 4 so as to be antiparallel.

That is, for example, when the inductance such as the motor is included in the load 1 in the inverter 2, the energy stored in the inductance has to be necessarily released when the switching element 4 is turned off. However, by the single switching element 4, the reverse current for releasing the energy stored in the inductance cannot be flowed. Accordingly, in order to reflux the electrical energy stored in this inductance, the diode 5 is connected to the switching element 4 in the reverse direction. That is, the diode 5 has a function of causing the reverse current to flow in order to release the electrical energy stored in the inductance.

As described above, according to the third embodiment, by using the semiconductor device described above in the first embodiment or the second embodiment for the diode 5, for example, the large area of the active region is largely taken, so that the number of diode elements can be reduced, and the power conversion device such as the inverter can be downsized.

In addition, the power conversion device can be used for a three-phase motor system. The above-described load 1 illustrated in FIG. 16 is a three-phase motor, and the three-phase motor system can be downsized by using a power conversion device provided with the semiconductor device described in the first embodiment or the second embodiment for the inverter 2.

Fourth Embodiment

Figure 17:
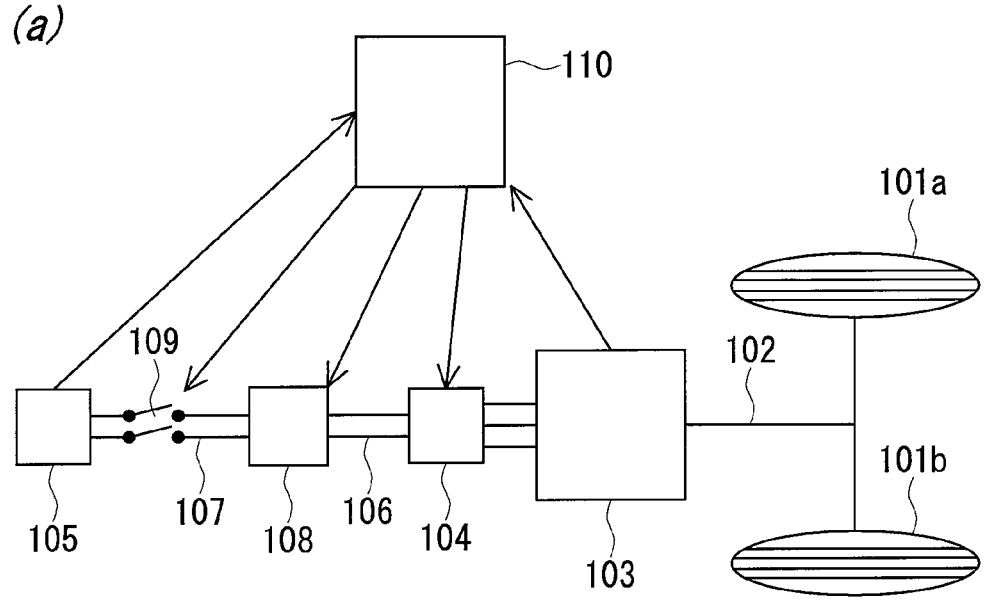
FIG. 17(a) is a schematic view illustrating an example of a configuration of an electric car according to a fourth embodiment.
FIG. 17(b) is a circuit diagram illustrating an example of a boost converter.
Figure 17:
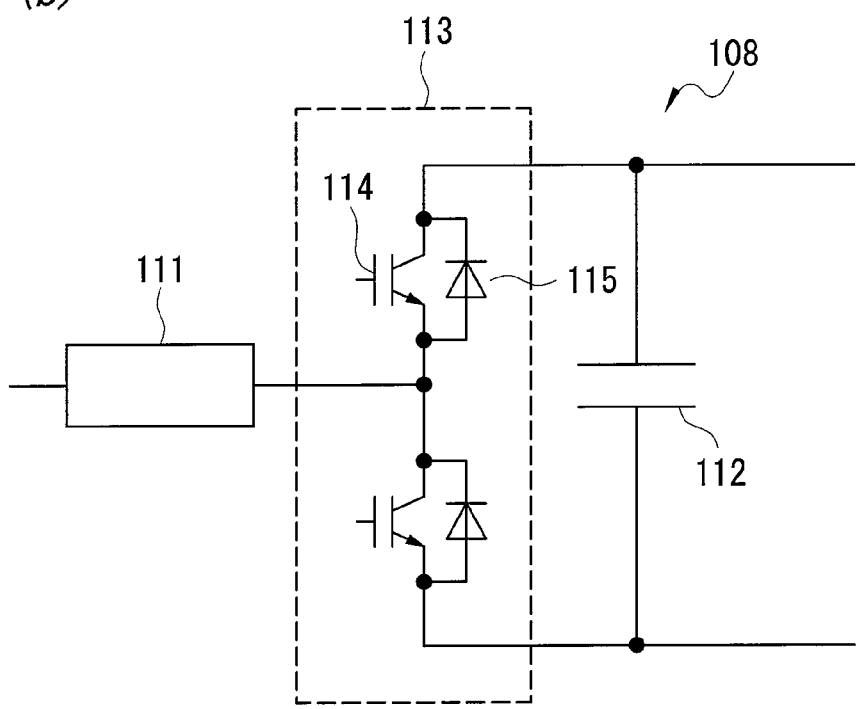

The three-phase motor system described above in the third embodiment can be used for an automobile such as a hybrid car or an electric car. The automobile using the three-phase motor system according to a fourth embodiment will be described with reference to FIGS. 17(*a*) and 17(*b*). FIG. 17(*a*) is a schematic diagram illustrating an example of a configuration of an electric car according to the fourth embodiment, and FIG. 17(*b*) is a circuit diagram illustrating an example of a boost converter according to the fourth embodiment.

As illustrated in FIG. 17(*a*), the electric car includes a three-phase motor 103 capable of inputting and outputting motive power to/from a driving shaft 102 to which a driving wheel 101*a* and a driving wheel 101*b* are connected, an inverter 104 for driving the three-phase motor 103, and a battery 105. Further, the electric car includes a boost converter 108, a relay 109, and an electronic control unit 110, and the boost converter 108 is connected to a power line 106 to which the inverter 104 is connected, and is connected to a power line 107 to which the battery 105 is connected.

The three-phase motor 103 is a synchronous generator motor including a rotor in which a permanent magnet is embedded, and a stator around which a three-phase coil is wound. For the inverter 104, the inverter 2 described above in the third embodiment can be used.

As illustrated in FIG. 17 (*b*), the boost converter 108 has such a configuration that a reactor 111 and a smoothing capacitor 112 are connected to the inverter 113. The inverter 113 is the same as the inverter 2 described above in the third embodiment, and each configuration of a switching element 114 and a diode 115 in the inverter 2 is also the same as each configuration of the switching element 4 and the diode 5 described above in the third embodiment.

The electronic control unit 110 includes a microprocessor, a storage device, and an input/output port, and receives a signal from a sensor that detects a rotor position of the three-phase motor 103, a charge/discharge value of the battery 105, or others. Then, the electronic control unit 110 outputs a signal for control of the inverter 104, the boost converter 108, and the relay 109.

As described above, according to the fourth embodiment, the power conversion device described above in the third embodiment can be used for the inverter 104 and the boost converter 108 which are the power conversion devices. In addition, the three-phase motor system described above in the third embodiment can be used for the three-phase motor system configured of the three-phase motor 103, the inverter 104, and others. In this manner, a volume of a drive system occupying the electric car can be reduced, and the downsizing, the weight reduction and the space saving of the electric car can be achieved.

Note that the electric car has been described in the fourth embodiment. However, the three-phase motor system can also be applied similarly to a hybrid car using an engine in combination.

Fifth Embodiment

Figure 18:
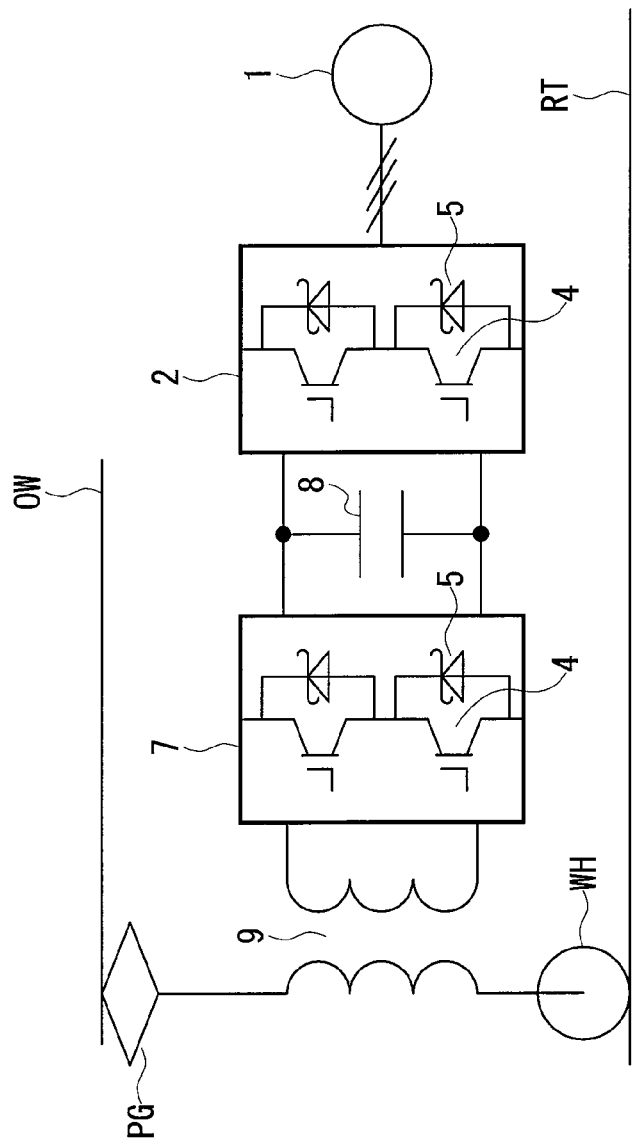
FIG. 18 is a circuit diagram illustrating examples of a converter and an inverter provided in a railway vehicle according to a fifth embodiment.

The three-phase motor system described above in the third embodiment can be used in a railway vehicle. A railway vehicle using the three-phase motor system according to a fifth embodiment will be described with reference to FIG. 18. FIG. 18 is a circuit diagram illustrating an example of a converter and an inverter to be included in the railway vehicle according to the fifth embodiment.

As illustrated in FIG. 18, power is supplied from overhead cable OW (for example, 25 kV) to the railway vehicle via a pantograph PG. The voltage is stepped down to 1.5 kV via a transformer 9, and is converted from an alternating current into a direct current by a converter 7. Further, a direct current is converted into an alternating current by the inverter 2 via a capacitor 8, so that a three-phase motor, i.e., a load 1, is driven. Each configuration of a switching element 4 and a diode 5 in the converter 7, and each configuration of the switching element 4 and the diode 5 in the inverter 2 are the same as each configuration of the switching element 4 and the diode 5 described above in the third embodiment. In FIG. 18, note that the control circuit 3 described above in the third embodiment is omitted. In addition, in the drawing, a reference symbol "RT" indicates a rail track, and a reference symbol "WH" indicates a wheel.

As described above, according to the fifth embodiment, the power conversion device described above in the third embodiment can be used for the converter 7. In addition, the three-phase motor system described above in the third embodiment can be used for the three-phase motor system including the load 1, the inverter 2, and the control circuit. In this manner, the downsizing and the weight reduction of the railway vehicle can be achieved.

In the foregoing, the invention made by the present inventors has been concretely described based on the embodiments. However, it is needless to say that the present invention is not limited to the foregoing embodiments and various modifications and alterations can be made within the scope of the present invention.

SYMBOL EXPLANATION 1 load
2 inverter
3 control circuit
4 switching element
5 diode
7 converter
8 capacitor
9 transformer
10 epitaxial layer
11 substrate
12 drift layer
13 p-type region
14 cathode electrode
15 anode electrode
16 JTE
17 high-concentration region
18 low-concentration region
19 medium-concentration region 20 p-type region
21 substrate
22 drift layer
23 p-type region
24 cathode electrode
25 anode electrode
26 JTE
27 high-concentration region
28 low-concentration region
30 p-type region
101a, 101b driving wheel
102 driving shaft
103 three-phase motor
104 inverter
105 battery
106, 107 power line
108 boost converter
109 relay
110 electric control unit
111 reactor
112 smoothing capacitor
113 inverter
114 switching element
115 diode
AR1 first region
AR2 second region
AR3 third region
IF insulating film
L1, L2, L3 first width
OW overhead cable
PG pantograph
RP1, RP2, RP3 mask material layer
RT rail track
S concentration gradient
S1 first concentration gradient
S2 second concentration gradient
S3 third concentration gradient
WH wheel

The invention claimed is:

1. A semiconductor device comprising:
a semiconductor substrate;
an n-type semiconductor layer formed on a front surface of the semiconductor substrate; and
a junction termination portion formed on an upper surface side of the semiconductor layer,
wherein the junction termination portion includes:
a p-type first semiconductor region having a first impurity concentration;
a p-type second semiconductor region having a second impurity concentration lower than the first impurity concentration; and
a p-type third semiconductor region having a third impurity concentration lower than the second impurity concentration,
the second semiconductor region is sandwiched by the first semiconductor regions in a first region,
the third semiconductor region is sandwiched by the first semiconductor regions in a second region provided to be closer to an end portion side of the semiconductor substrate than the first region, and
only the third semiconductor region exists in a third region provided to be closer to an end portion side of the semiconductor substrate than the second region.

2. The semiconductor device according to claim 1,
wherein the semiconductor layer is made of silicon carbide.

3. The semiconductor device according to claim 1,
wherein the first region, the second region, and the third region contain aluminum.

4. A power conversion device including the semiconductor device according to claim 1.

5. A three-phase motor system including the power conversion device according to claim 4.

6. An automobile including the three-phase motor system according to claim 5.

7. A railway vehicle including the three-phase motor system according to claim 5.

* * * * *